(12) United States Patent
Baggett et al.

(10) Patent No.: US 11,114,330 B2
(45) Date of Patent: Sep. 7, 2021

(54) SUBSTRATE SUPPORT HAVING CUSTOMIZABLE AND REPLACEABLE FEATURES FOR ENHANCED BACKSIDE CONTAMINATION PERFORMANCE

(71) Applicant: Axcelis Technologies, Inc., Beverly, MA (US)

(72) Inventors: John Baggett, Amesbury, MA (US); Dave Shaner, Georgetown, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 90 days.

(21) Appl. No.: 16/549,239

(22) Filed: Aug. 23, 2019

(65) Prior Publication Data

US 2020/0066570 A1 Feb. 27, 2020

Related U.S. Application Data

(60) Provisional application No. 62/722,359, filed on Aug. 24, 2018.

(51) Int. Cl.
*H01L 21/687* (2006.01)
*H01L 21/67* (2006.01)
*H01L 21/683* (2006.01)

(52) U.S. Cl.
CPC .... *H01L 21/6875* (2013.01); *H01L 21/67248* (2013.01); *H01L 21/67288* (2013.01); *H01L 21/6833* (2013.01); *H01L 21/68735* (2013.01); *H01L 21/68757* (2013.01)

(58) Field of Classification Search
CPC ........... H01L 21/6875; H01L 21/67248; H01L 21/68757; H01L 21/6833; H01L 21/68735; H01L 21/67288; H01L 21/67109; H01L 21/6831
USPC ........................................................ 361/234
See application file for complete search history.

(56) References Cited

U.S. PATENT DOCUMENTS

| | | | | |
|---|---|---|---|---|
| 5,656,093 A * | 8/1997 | Burkhart | ............. | H01L 21/6831 118/728 |
| 7,824,498 B2 * | 11/2010 | Parkhe | ............... | H01L 21/68757 118/728 |
| 9,613,846 B2 | 4/2017 | Raj | | |
| 10,020,170 B2 | 7/2018 | Sun | | |
| 10,020,218 B2 | 7/2018 | Boyd, Jr. | | |
| 2009/0122458 A1 * | 5/2009 | Lischer | ............... | H01L 21/6831 361/234 |
| 2012/0262834 A1 * | 10/2012 | Eytan | .................. | H01L 21/6833 361/234 |

(Continued)

*Primary Examiner* — Dharti H Patel
(74) *Attorney, Agent, or Firm* — Eschweiler & Potasshnik, LLC

(57) ABSTRACT

A workpiece support has a support surface where one or more standoffs are selectively removably coupled to the support surface. The one or more standoffs are operable to support a workpiece at a predetermined standoff distance from the support surface. A gap may be defined between the support surface and the workpiece. The one or more standoffs may be an electrically insulative film, such as a polyimide film that is selectively removably coupled to the support surface by an adhesive. The workpiece support may be an electrostatic chuck (ESC). Electrodes positioned below the support surface may electrostatically attract the workpiece toward the support, where a gas may be introduced in the gap.

27 Claims, 7 Drawing Sheets

(56) References Cited

U.S. PATENT DOCUMENTS

2015/0138687 A1* 5/2015 Boyd, Jr. .......... H01L 21/67288
361/234

* cited by examiner

SUBSTRATE SUPPORT HAVING CUSTOMIZABLE AND REPLACEABLE FEATURES FOR ENHANCED BACKSIDE CONTAMINATION PERFORMANCE

REFERENCE TO RELATED APPLICATIONS

This application is a U.S. Non-Provisional application which claims the benefit of U.S. Provisional Application Ser. No. 62/722,359 filed Aug. 24, 2018, entitled "SUBSTRATE SUPPORT HAVING CUSTOMIZABLE AND REPLACEABLE FEATURES FOR ENHANCED BACKSIDE CONTAMINATION PERFORMANCE", the contents of which are herein incorporated by reference in their entirety.

FIELD

The present disclosure relates generally to workpiece processing systems and methods for processing workpieces, and more specifically to an apparatus, system and method for supporting a workpiece.

DETAILED DESCRIPTION

Figure 1:
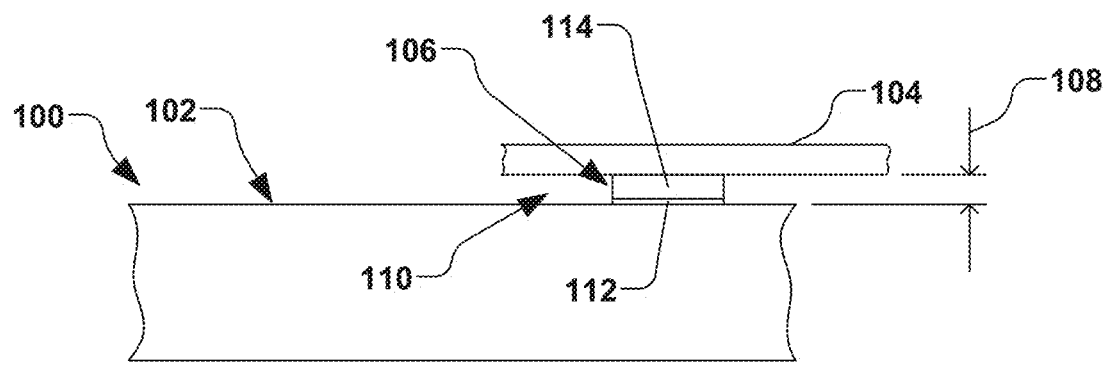
FIG. 1 is a partial side view of a workpiece support having a standoff in accordance with various aspects of the present disclosure.

The present disclosure is directed generally toward workpiece supports, and more particularly, to a workpiece support having one or more standoffs operable to be selectively affixed and/or removably coupled to a support surface. The one or more standoffs are operable to support a workpiece at a predetermined standoff distance from the support surface. The one or more standoffs are operable to provide substantial wear resistance and limit particle contamination, while being easily removable and replaceable.

Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

Workpiece supports and/or workpiece clamps are utilized in the semiconductor industry for supporting and/or clamping workpieces or substrates, such as during plasma-based or vacuum-based semiconductor processes. Such processes, for example, can include ion implantation, etching, chemical vapor deposition (CVD), thermal processing, and other processing of workpieces or wafers.

Workpiece supports such as electrostatic clamps or chucks (ESCs), for example, are valuable in processing semiconductor substrates or workpieces, such as silicon wafers. Clamping capabilities of the ESCs can be controlled, as well as a control of temperature of the workpiece residing on the ESC can be achieved in various ways. An ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation), a clamping voltage is applied between the wafer and the electrode, wherein the wafer is selectively attracted toward the chuck surface by electrostatic forces.

A subset of electrostatic clamps, referred to as Johnsen-Rahbek (J-R) clamps, utilize "leaky" dielectric layers (e.g., semiconductive dielectric layers having bulk resistances of between approximately $1 \times 10^8$ to $1 \times 10^{12}$ Ohm-cm) in contact with the wafer, wherein greater clamping forces can be achieved at lower voltages than with conventional non-J-R clamps. Lower voltage input to the ESC not only reduces power supply requirements associated with the J-R clamps, but further provides a clamping environment that is potentially less destructive to the wafer and devices formed thereon. A J-R clamp, for example, comprises a dielectric layer that is slightly conductive, thus generally permitting a thickness of the dielectric layer (e.g., a ceramic) to be much thicker than would be permitted for a "classic" or Coulombic ESC. Such an increase in thickness facilitates the clamp manufacturing process, while also reducing clamp operating voltages.

Backside gases can be further utilized in order to cool and/or heat the workpiece during processing. In such instances, a heat transfer gas (a backside gas) is presented between the workpiece and a surface of the ESC, wherein the pressure of the backside gas is generally proportional to the heat transfer coefficient thereof. In order to attain a higher heat transfer rate for example, a higher backside gas pressure is utilized to provide the desired thermal performance. In order to maintain proper clamping of the workpiece, forces associated with the higher backside gas pressure should be properly offset with a larger clamping force or voltage applied to the ESC.

In semiconductor processing, many operations, such as ion implantation, may be performed on the workpiece or semiconductor wafer. As ion implantation processing technology advances, a variety of ion implantation temperatures at the workpiece can be implemented to achieve various implantation characteristics in the workpiece. For example, three temperature regimes are generally considered: cold implants, where process temperatures at the workpiece are maintained at temperatures below room temperature, hot implants, where process temperatures at the workpiece are maintained at high temperatures typically ranging from 100-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, may achieve a high process temperature via a dedicated high temperature electrostatic chuck (ESC), also called a heated chuck. The heated chuck holds or clamps the workpiece to a surface thereof during implantation. A high temperature ESC, for example, comprises a set of heaters embedded under the clamping surface for heating the ESC and workpiece to the process temperature (e.g., 100° C.-600° C.), whereby a gas interface provides a thermal interface from the clamping surface to the backside of the workpiece.

Chilled ion implantation processes provide a room temperature workpiece on a chilled chuck, and the chilled chuck is cooled to a chilled temperature (e.g., a temperature below room temperature), thereby cooling the workpiece. Cooling the chilled chuck provides for a removal of thermal energy imparted into the workpiece from the ion implantation, while further maintaining the chuck and workpiece at the chilled temperature during the implant via the removal of heat through the chilled chuck.

Ion implantation processes are also performed at so-called "quasi-room temperature" (e.g., a temperature slightly elevated above room temperature, such as at 50-60° C., but not as high as a hot ion implantation process), whereby a low-heat chuck (e.g., a chuck operable to heat to a temperature less than 100° C.) is used to control the temperature of the workpiece during implantation.

It is appreciated that intimate contact between workpiece handling components (e.g., workpiece supports), and the workpiece or wafer can result in contamination of particles and metals associated with the intimate contact to the back side of the workpiece or wafer. In attempts to mitigate such contamination associated with the contact, "mesas" or "lands" have been conventionally integrated into the surface of the electrostatic in an attempt to reduce backside contamination by reducing contact points between the support and the wafer. Examples of such mesas are described in U.S. Pat. Nos. 10,020,218, 10,020,170, and 9,613,846. However, since these mesas are conventionally integral to the clamping surface (e.g., machined or built-in to the clamping surface), they typically have a high hardness to reduce wear and replacement of the expensive ESC. When the mesas wear down, the entire surface of the ESC is replaced. Further, the high hardness associated with the mesas can lead to increased particle contamination due to the contact with the workpiece and/or metal particle or other material transfer to the workpiece.

Contamination on the backside of workpiece can be problematic not only due to the intimate contact with the ESC surface, but can also be exacerbated by clamping forces between backside of workpiece and a clamping surface of the ESC. ESCs are typically comprised of materials that support electrostatic clamping behavior required for the operation of the ESC, but such materials can also deleteriously cause contamination. The present appreciates that in order to reduce such contamination, wafer contact materials can be utilized that involve a softer or compliant material. However, in comparison with the mesas described above, such materials can exhibit wear relatively quickly and can require refurbishment or replacement on an accelerated schedule, thus increasing the cost of operation of the ESC.

To this end, the present disclosure provides field-replaceable standoffs which provide a buffer between a surface of a workpiece handling component (e.g., a workpiece support surface such as an ESC surface or any other surface operable to support the workpiece) and the workpiece in order to substantially reduce (or eliminate) the contact between the workpiece and workpiece handling components, whereby particle or metal transfer to the workpiece is generally mitigated. Such standoffs can be variously sized and arranged in any customized pattern for optimized performance for different types of workpieces or for different types of workpiece handling components.

Referring now to FIG. 1, a simplistic example of one aspect of the disclosure is provided, wherein a workpiece support 100 is provided. The workpiece support 100, for example, comprises a support surface 102 operable to generally support a workpiece 104. The support surface 102, for example, may be electrically insulative or electrically conductive. In one example, the support surface 102 is generally planar.

The one or more standoffs 106 are selectively coupled to the support surface 102. The one or more standoffs 106, for example, are operable to be selectively fixed (e.g., removably affixed or removably coupled) to the support surface 102, wherein the one or more standoffs are operable to support the workpiece 104 at a predetermined standoff distance 108 from the support surface. For example, the one or more standoffs 106 generally define the predetermined standoff distance 108. In one example, the one or more standoffs 106 generally define a gap 110 between the support surface 102 and the workpiece 104. The predetermined standoff distance 108 in one example is less than approximately 0.005 inches. In another example, the predetermined standoff distance 108 is greater than approximately 0.001 inches.

The one or more standoffs 106, for example, may comprise or be comprised of a generally resilient material, such as silicone. The one or more standoffs 106, for example, may comprise or be comprised of a non-metallic material. In one example, the one or more standoffs 106 comprise an adhesive 112 operable to selectively couple the one or more standoffs to the support surface 102. The adhesive 112, for example, may comprise a silicone adhesive or other adhesive.

The one or more standoffs 106, for example, may be electrically insulative or electrically conductive, based on the desired application. Further, the one or more standoffs 106, for example, may have a low thermal conductivity or high thermal conductivity, based on the desired application. The one or more standoffs 106, for example, may comprise or be comprised of an organic material. In one example, the one or more standoffs 106 are devoid of any metal that could contaminate an ion implantation process.

The one or more standoffs 106, for example, may be comprised of one or more materials operable to withstand high temperatures (e.g., 50 C to 600 C or more) without significant degradation or compression. The one or more standoffs 106, for example, may be comprised of a material that is generally incompressible. In one example, the one or more standoffs 106 are comprised of a material having a hardness that is less than a hardness of the workpiece 104.

In one example, the one or more standoffs 106 comprise a film 114. The film 114 may be adherently coupled to the adhesive 112. The one or more standoffs 106, for example, may comprise a polyimide film. The one or more standoffs 106, for example, may comprise one or more of strips or dots having variable size.

In one example, the one or more standoffs 106 comprise or are comprised of a non-metallic material. The one or more standoffs 106, for example, may be comprised of one or more materials material that are generally resistant to deterioration in the presence of one or more predetermined gases, materials, and/or temperatures. The one or more standoffs 106, for example, may be comprised of one or more materials that are generally resistant to abrasion or other degradation in the presence of, or in contact with, the workpiece 104.

Figure 2:
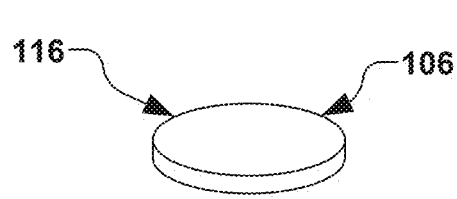
FIG. 2 is a perspective view of a standoff in accordance with various aspects of the present disclosure.
Figure 3:
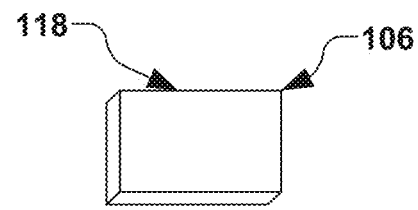
FIG. 3 is a perspective view of another standoff in accordance with various aspects of the present disclosure.
Figure 4:
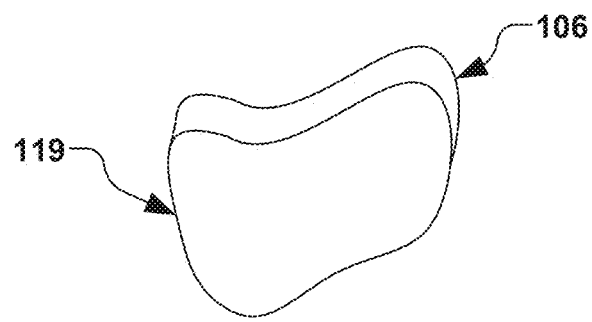
FIG. 4 is a perspective view of yet another standoff in accordance with various aspects of the present disclosure.

The one or more standoffs 106, for example, may be formed in a predetermined shape when viewed perpendicular to the support surface 102. For example, the predetermined shape may be one or more of a rounded shape 116 such as an ovular or circular shape shown in FIG. 2, a polygonal shape 118 such as a square or rectangular shape shown in FIG. 3, and a freeform shape 119 having any combination of rounded and straight edges shown in FIG. 4. The one or more standoffs 106 of FIG. 1, for example, may be formed in the predetermined shape when viewed perpendicular to the support surface 102 prior to be applied to the support surface. Alternatively, the one or more standoffs 106 may take any shape when applied to the support surface 102, such as when applied as a liquid or gel. For example, the one or more standoffs 106 are initially comprised of a liquid or gel that is applied to the support surface 102 and subsequently cured or generally solidified on the support surface.

Figure 5:
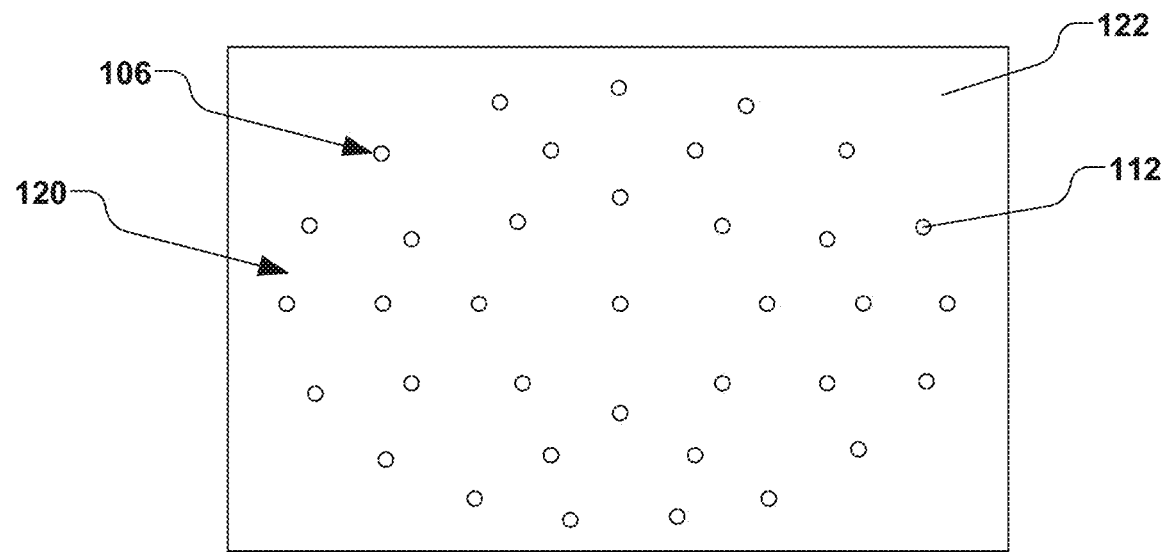
FIG. 5 is a plan view of a plurality standoffs on a transfer sheet in accordance with various aspects of the present disclosure.
Figure 6:
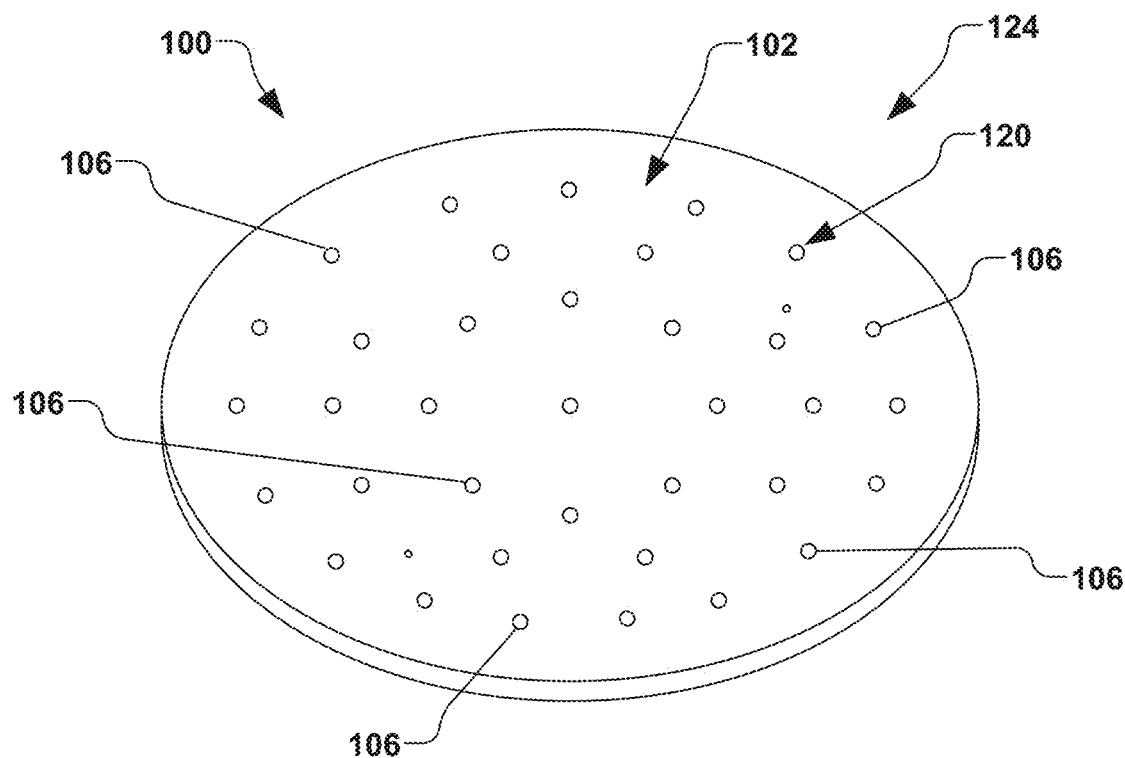
FIG. 6 illustrates a perspective view of a top of a support surface of a workpiece support having standoffs in accordance with various aspects of the present disclosure.

The one or more standoffs 106, for example, may be initially defined on a transfer sheet 120 illustrated in FIG. 5, whereby the one or more standoffs are operable to be generally transferred from the transfer sheet to the support surface 102 of FIG. 6 by placement of the transfer sheet on the support surface and selectively adhering the one or more standoffs from the transfer sheet to the support surface. The one or more standoffs 106, for example, may be spaced along the support surface 102 in a predetermined pattern 122, such as illustrated in FIG. 6. In the case of the one or more standoffs 106 being initially defined on a transfer sheet 120 of FIG. 5, the predetermined pattern 122 may be defined on the transfer sheet and transferred to the support surface 102 of FIG. 6 by placing the adhesive 112 of the one or more standoffs on the support surface 102 and subsequently removing the transfer sheet.

In one example, the support surface 102 is generally planar and generally devoid of protrusions extending therefrom. The support surface 102, for example, may be electrically insulative or electrically conductive. The one or more standoffs 106 may be selectively coupled to the support surface 102, as described above in a variety of ways, such as individually, in groups or two or more, as a unit comprised of a plurality standoffs.

Figure 7:
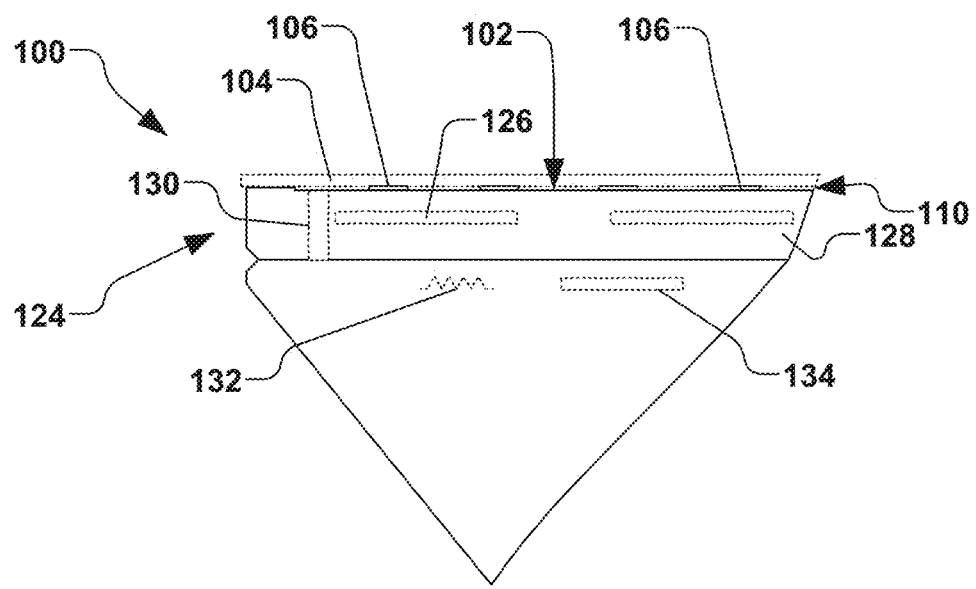
FIG. 7 is a partial cross-sectional view of an exemplary ESC in accordance with various aspects of the present disclosure.

The workpiece support 100, for example, may comprise an electrostatic chuck (ESC) 124. As illustrated in the partial illustration of FIG. 7, the electrostatic chuck 124, for example, comprises one or more electrodes 126 positioned below the support surface 102, wherein the one or more electrodes are operable to electrostatically attract the workpiece 104 toward the support surface based, at least in part, on an electrical voltage or current applied to the one or more electrodes. The one or more electrodes 126 may be associated with a dielectric layer 128 of the ESC 124. One or more gas orifices 130 may be associated with the support surface 102, wherein the one or more gas orifices are fluidly coupled to the gap 110. A gas source (not shown), for example, is operable to supply a gas to the gap 110 between the workpiece 104 and support surface 102 via the one or more gas orifices 130, whereby the gas may be utilized to conduct thermal energy between the workpiece and the support surface 102.

The workpiece support 100, for example, may comprise one or more of a thermal workpiece support operable to heat and/or cool the workpiece 104. For example, one or more heaters 132 or cooling channels or apparatuses 134 may be integrated into the workpiece support 100 for selectively heating and/or cooling the workpiece 104. It should be understood that the workpiece support 100 shown in FIG. 7 may alternatively comprise any workpiece support operable to heat and/or cool the workpiece 104, and that the present disclosure is not limited to the workpiece support being an ESC 124.

The one or more standoffs 106, for example, may be positioned on the support surface 102 based on predetermined criteria, such as a desired electrostatic force or attraction to the support surface, a bending strength of the workpiece 104, or other predetermined criteria. The one or more standoffs 106 and the support surface 102 may have similar dielectric strengths.

Figure 8:
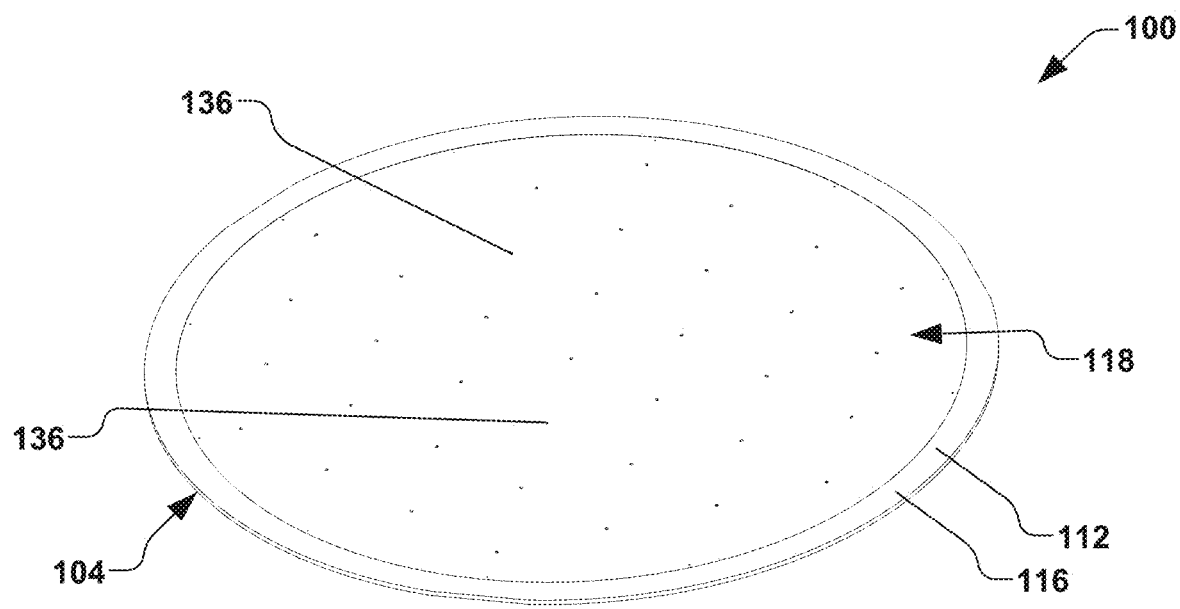
FIG. 8 is a perspective view of a top of an exemplary ESC in accordance with various aspects of the present disclosure.

In accordance with another exemplary aspect of the disclosure, the support surface 102 may further comprise one or more protrusions or mesas 136, as illustrated in FIG. 8. In some ESCs, the one or more protrusions or mesas 136 generally extend outwardly from the support surface 102 and in some circumstances, are operable to contact the workpiece 104, in order to generally support an interior region of the workpiece during clamping thereof. The one or more protrusions or mesas 136, for example, extend a protrusion distance from a planar region 138 of the support surface 102.

Figure 9:
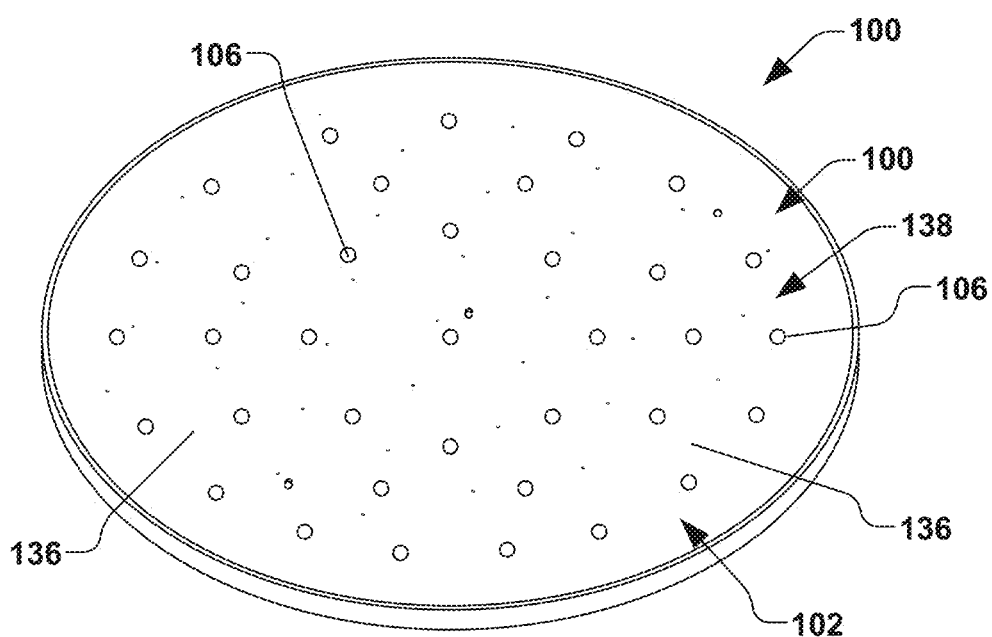
FIG. 9 is a perspective view of a top of an exemplary ESC having one or more standoffs selectively coupled thereto in accordance with various aspects of the present disclosure.

In one example, the protrusion distance is less than the standoff distance 108 of FIG. 1, whereby the one or more standoffs 106 of the present disclosure are operable to generally limit or prevent contact between the workpiece 104 and the one or more protrusions or mesas 136 of FIG. 8. In one example, the one or more standoffs 106 may be selectively coupled to the support surface 102 in the planar region 138, as illustrated in FIG. 9. In another example, the one or more standoffs 106 may be selectively coupled anywhere to the support surface 102 and further cover or contact the one or more protrusions or mesas 136. In one example, the one or more standoffs 106 may be compliant such that the standoff distance 108 of FIG. 1 is generally maintained constant (e.g., the one or more standoffs 106 conform around the one or more protrusions or mesas 136).

In another example, the one or more standoffs 106 are selectively positioned based on a desired condition, such as to avoid a location of the one or more protrusions or mesas 136, or any other condition. Thus, the one or more standoffs 106 may be applied to or retrofitted to any workpiece support, such as ESCs, preheat platens, post-cool platens, or any other platen or workpiece support.

Figure 10:
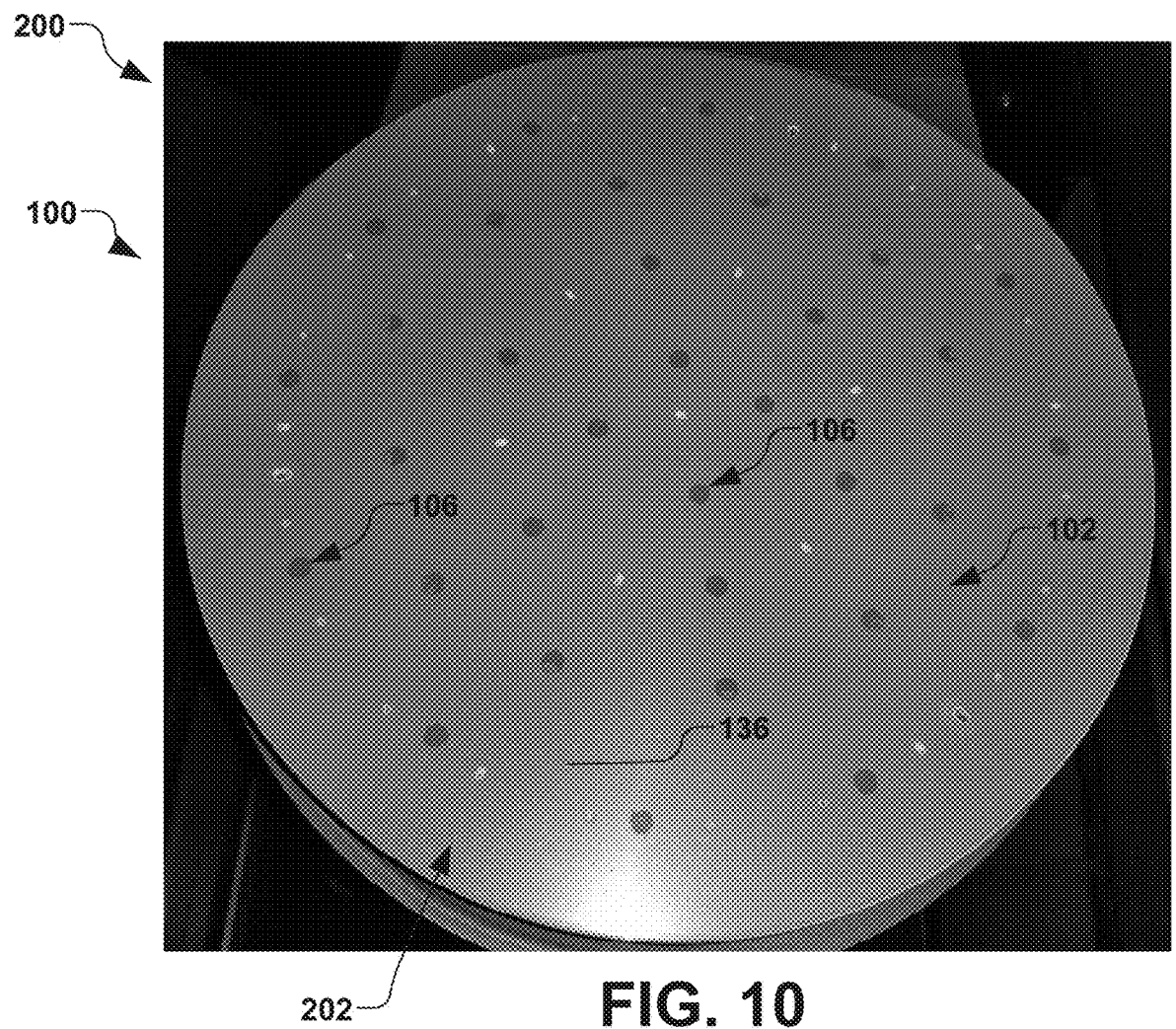
FIG. 10 is a photo of a top of an exemplary workpiece support having one or more standoffs selectively coupled thereto in accordance with various aspects of the present disclosure.
Figure 11:
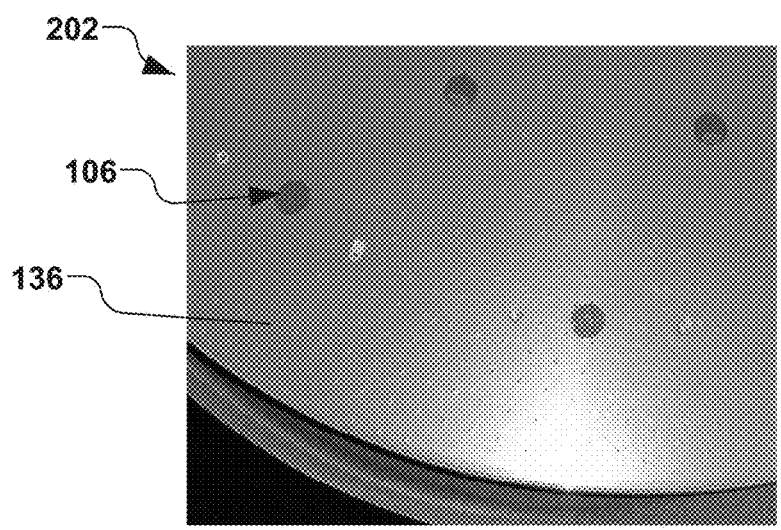
FIG. 11 is a photo showing an enlarged portion of the exemplary workpiece support of FIG. 10.

FIG. 10 illustrates a photo of an ESC 200 wherein the one or more standoffs 106 of the present disclosure are provided on the support surface 102 thereof. FIG. 11 illustrates a blown up portion 202 of the ESC 200 of FIG. 10, whereby the one or more protrusions or mesas 136 are further illustrated. As shown, the one or more standoffs 106 are provided on the support surface 102 and at least partially cover or reside over one or more of the one or more standoffs 106. As described above, the one or more standoffs 106 thus limit contact with the one or more protrusions or mesas 136, thus reducing particles and/or metal contamination conventionally seen when the one or more protrusions or mesas conventionally contact the workpiece 104 of FIG. 8 in the absence of the one or more standoffs.

The one or more standoffs 106, for example, are removable, replaceable, and easily/selectively coupled. The one or more standoffs 106, for example, may be placed on the support surface 102 in any pattern or spacing, whereby when worn, they can be selectively removed and replaced, thus mitigating expenses associated with retrofitting, replacing, or modifying the ESC.

Further, in another example, the one or more standoffs 106 may be removed by selective scraping or wiping of the support surface 102, such as by a scraper tool and/or application of a solvent (e.g., isopropyl alcohol) to remove adhesive 112 of FIG. 1.

Figure 12:
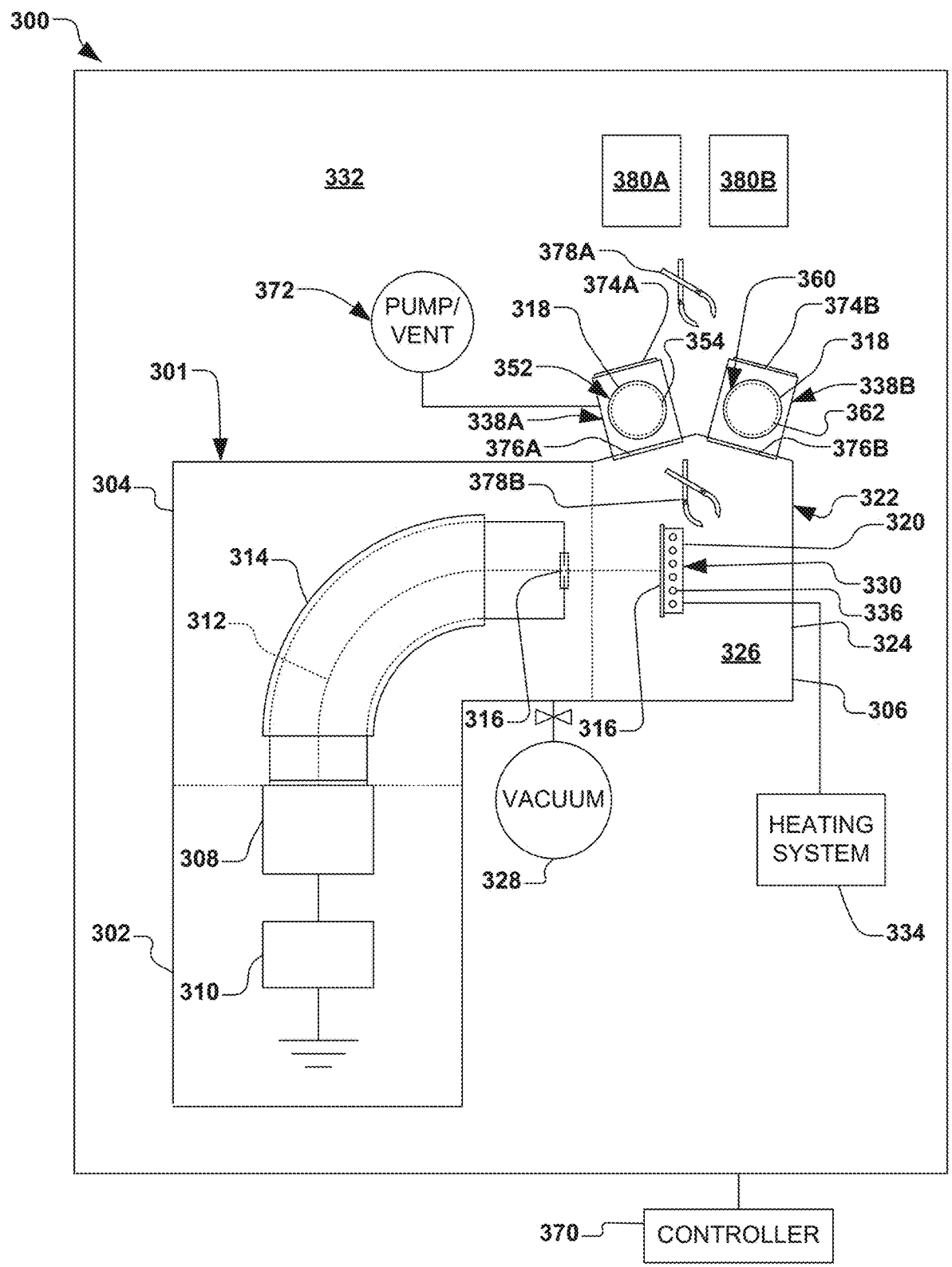
FIG. 12 is a block diagram illustrating an exemplary ion implantation system in accordance with various aspects of the present disclosure.

The present disclosure may be implemented in a variety of semiconductor processing systems, such as an ion implantation system, a plasma processing system, or any applicable semiconductor processing system. For example, FIG. 12 illustrates an exemplary ion implantation system 300 where the workpiece support 100 of FIG. 1 may be implemented in a variety of ways. The ion implantation system 300 of FIG. 12, for example, comprises an exemplary ion implantation apparatus 301, however various other types of vacuum-based semiconductor processing systems are also contemplated, such as plasma processing systems, or other semiconductor processing systems. The ion implantation apparatus 301, for example, comprises a terminal 302, a beamline assembly 304, and an end station 306.

Generally speaking, an ion source 308 in the terminal 302 is coupled to a power supply 310 to ionize a dopant gas into a plurality of ions and to form an ion beam 312. The ion beam 312 in the present example is directed through a mass analysis apparatus 314, and out an aperture 316 towards the end station 306. In the end station 306, the ion beam 312 bombards a workpiece 318 (e.g., a substrate such as a silicon wafer, a display panel, etc.), which is selectively clamped or mounted to a thermal chuck 320. The thermal chuck 320, for example, may comprise an electrostatic chuck (ESC) or mechanical clamp chuck, wherein the thermal chuck is operable to selectively control a temperature of the workpiece 318. The thermal chuck 320, for example, may comprise the workpiece support 100 of FIG. 1. Once embedded into the lattice of the workpiece 318 of FIG. 12, the implanted ions change the physical and/or chemical properties of the workpiece. Because of this, ion implantation is used in semiconductor device fabrication and in metal finishing, as well as various applications in materials science research.

The ion beam 312 of the present disclosure can take any form, such as a pencil or spot beam, a ribbon beam, a scanned beam, or any other form in which ions are directed toward end station 306, and all such forms are contemplated as falling within the scope of the disclosure.

According to one exemplary aspect, the end station 306 comprises a process chamber 322, such as a vacuum chamber 324, wherein a process environment 326 (e.g., a vacuum environment) is associated with the process chamber. The process environment 326 generally exists within the process chamber 322, and in one example, comprises a vacuum produced by a vacuum source 328 (e.g., a vacuum pump) coupled to the process chamber and operable to substantially evacuate the process chamber.

In one example, the ion implantation apparatus 301 is operable to provide a high temperature ion implantation, wherein the workpiece 318 is heated to a process temperature (e.g., approximately 100-600° C. or greater). Thus, in the present example, the thermal chuck 320 comprises a heated chuck 330, wherein the heated chuck is operable to support and retain the workpiece 318 while further heating the workpiece 318 within the process chamber 322 prior to, during, and/or after the exposure of the workpiece to the ion beam 312.

The heated chuck 330, for example, comprises an electrostatic chuck (ESC) operable to heat the workpiece 318 to a processing temperature that is considerably greater than an ambient or atmospheric temperature of the surroundings or external environment 332 (e.g., also called an "atmospheric environment"). A heating system 334 may be further provided, wherein the heating system is operable to heat the heated chuck 330 and, in turn, the workpiece 318 residing thereon to the desired processing temperature. The heating system 334, for example, is operable to selectively heat the workpiece 318 via one or more heaters 336 disposed within the heated chuck 330. In one alternative, the heating system 334 comprises a radiant heat source, such as one or more a halogen lamp, light emitting diode, and infrared thermal device operable to selectively heat the workpiece.

For some high temperature implants, the workpiece 318 may allowed to "soak" on the heated chuck 330 within the vacuum of the process environment 326 until the desired temperature is reached. Alternatively, in order to increase cycle time through the ion implantation system 300 the workpiece may be pre-heated in one or more chambers 338A, 338B (e.g., one or more load lock chambers) operatively coupled to the process chamber 322 via a pre-heat apparatus 352 (e.g., comprising a workpiece support 100 of FIG. 1).

Depending on the tool architecture, process, and desired throughput, the workpiece 318 of FIG. 12 may be preheated to the first temperature via the pre-heat apparatus 352, wherein the first temperature is equal to or lower than the process temperature, thus allowing for a final thermal equalization on the heated chuck 330 inside the vacuum chamber 324. Such a scenario allows the workpiece 318 to lose some heat during transfer to the process chamber 322, wherein final heating to the process temperature is performed on the heated chuck 330. Alternatively, the workpiece 318 may be preheated via the pre-heat apparatus 352 to a first temperature that is higher than the process temperature. Accordingly, the first temperature would be optimized so that cooling of the workpiece 318 during transfer to the process chamber 322 is just enough for the workpiece to be at the desired process temperature as it is clamped onto the heated chuck 330.

In order to accurately control and/or accelerate the thermal response and enable an additional mechanism for heat transfer, the back side of the workpiece 318 is brought into conductive communication with the heated chuck 330. This conductive communication is achieved through a pressure controlled gas interface (also called "back side gas") between the heated chuck 330 and the workpiece 318. Pressure of the back side gas, for example, is generally limited by the electrostatic force of the heated chuck 330, and can be generally kept in the range of 5-20 Torr. In one example, the back side gas interface thickness (e.g., the distance between the workpiece 318 and the heated chuck 330) is controlled on the order of microns (typically 5-20 µm), and as such, the molecular mean free path in this pressure regime becomes large enough for the interface thickness to push the system into the transitional and molecular gas regime.

In accordance with another aspect of the disclosure, chamber 338B comprises a cooling apparatus 360 operable to cool the workpiece when the workpiece 318 is disposed within the chamber 338B subsequent to being implanted with ions during ion implantation. The cooling apparatus 360, for example, may comprise a chilled workpiece support 362, wherein the chilled workpiece support is operable to actively cool the workpiece 318 residing thereon via thermal conduction. The chilled workpiece support 362, for example, comprises a cold plate having a one or more cooling channels passing therethrough, wherein a cooling fluid passing through the cooling channel substantially cools the workpiece 318 residing on a surface of the cold plate. The chilled workpiece support 362 may comprise other cooling mechanisms, such as Peltier coolers or other cooling mechanisms known to one of ordinary skill. The chilled workpiece support 362 may comprise a workpiece support 100 of FIG. 1.

In accordance with another exemplary aspect, a controller 370 of FIG. 12 is further provided and operable to selectively activate one or more of the heating system 334, the pre-heat apparatus 352, and the cooling apparatus to selectively heat or cool the workpiece 318 respectively residing thereon. The controller 370, for example, may be operable to heat the workpiece 318 in chamber 338A via the pre-heat apparatus 352, to heat the workpiece to a predetermined temperature in the processing chamber 322 via the heated chuck 330 and heating system 334, to implant ions into the workpiece via the ion implantation apparatus 301, to cool the workpiece in chamber 338B via the cooling apparatus 360, and to selectively transfer the workpiece between the atmospheric environment 332 and the vacuum environment 326 via control of a pump and vent 372, the respective atmospheric doors 374A, 374B and vacuum doors 376A, 376B of the respective chambers 338A, 338B, and workpiece transfer apparatus 378A, 378B.

In one example, the workpiece 318 may be further delivered to and from the process chamber 322 such that the workpiece is transferred between a selected front opening unified pod (FOUP) 380A, 380B and chambers 338A, 338B via workpiece transfer apparatus 378A, and further transferred between the chambers 338A, 338B and the heated chuck 330 via workpiece transfer apparatus 378B. The controller 370, for example, is further operable to selectively transfer the workpiece between the FOUPs 380A, 380B, chambers 338A, 338B, and heated chuck 330 via a control of the workpiece transfer apparatus 378A, 378B.

The system 300 of FIG. 12 of the present disclosure, for example, may further be advantageously operable to perform both high temperature implants (e.g., in the range of 100-600° C.) and quasi-room temperature implants (e.g., in the range of 20-100° C.) while utilizing the same heated chuck 330. Such a configuration is advantageous over conventional systems in both simplicity, as well as productivity, as the system 300 of FIG. 12 may be utilized in various implantation schemes with minimal changes in configuration while mitigating various deficiencies commonly seen in conventional startup operations of conventional ion implantation systems.

Figure 13:
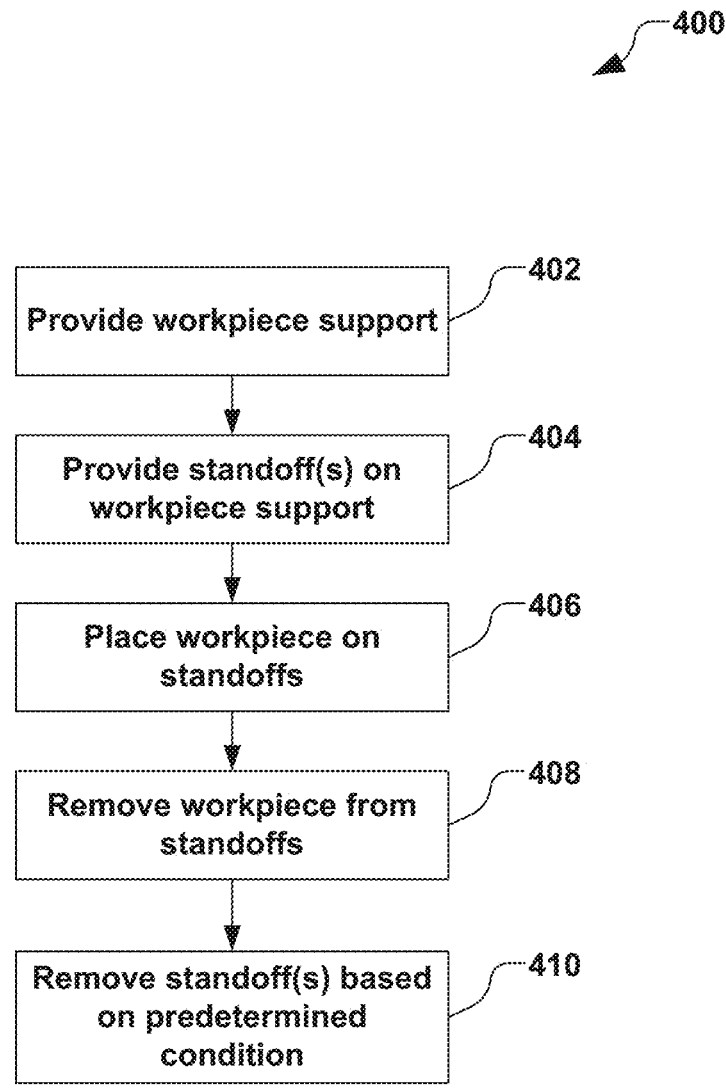
FIG. 13 is a block diagram illustrating an exemplary method for selectively applying one or more standoffs to a workpiece support according to another exemplary aspect of the disclosure.

In another aspect of the disclosure, FIG. 13 illustrates a method 400 for selectively applying one or more standoffs to a workpiece support and for selectively supporting a workpiece. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 400 shown in FIG. 13, for example, begins in act 402, wherein a workpiece support is provided. In act 404, one or more standoffs are applied to the workpiece. In act 406, the workpiece is placed on the one or more standoffs, wherein the workpiece is supported by the one or more standoffs at a predetermined standoff distance from a surface of the workpiece. In act 408, the workpiece is removed from the one or more standoffs. In act 410, the one or more standoffs are removed from the workpiece support. The performance of act 410 may occur after one or more predetermined conditions are met, such as an amount of time, a number of workpieces that have been supported, a contamination of a system using the workpiece support, and a deterioration of the one or more workpiece supports.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A workpiece support, comprising:
   an electrostatic chuck (ESC) having a support surface; and
   one or more standoffs selectively removably coupled to the support surface, wherein the one or more standoffs are operable to support a workpiece at a predetermined standoff distance from the support surface.

2. The workpiece support of claim 1, wherein the one or more standoffs define a gap between the support surface and the workpiece.

3. The workpiece support of claim 2, wherein the electrostatic chuck comprises one or more electrodes positioned below the support surface, wherein the one or more electrodes are operable to electrostatically attract the workpiece toward the support surface based, at least in part, on an electrical voltage or current applied to the one or more electrodes.

4. The workpiece support of claim 3, wherein the support surface is electrically insulative.

5. The workpiece support of claim 2, wherein the electrostatic chuck comprises one or more gas orifices associated with the support surface, wherein the one or more gas orifices are fluidly coupled to the gap.

6. The workpiece support of claim 5, further comprising a gas source operable to supply a gas to the gap between the workpiece and support surface via the one or more gas orifices.

7. The workpiece support of claim 1, wherein the support surface is substantially planar and is devoid of protrusions extending therefrom.

8. The workpiece support of claim 1, wherein the support surface is substantially planar and comprises a plurality of mesas extending a protrusion distance from a planar region of the support surface, wherein the protrusion distance is less than the standoff distance.

9. The workpiece support of claim 1, wherein the one or more standoffs comprise a resilient material.

10. The workpiece support of claim 9, wherein the one or more standoffs comprise a non-metallic material.

11. The workpiece support of claim 1, wherein the one or more standoffs comprise an adhesive operable to selectively couple the one or more standoffs to the support surface.

12. The workpiece support of claim 11, wherein the adhesive comprises a silicone adhesive.

13. The workpiece support of claim 1, wherein the one or more standoffs comprise a polyimide film.

14. The workpiece support of claim 1, wherein the one or more standoffs comprise an electrically insulative film.

15. The workpiece support of claim 1, wherein the predetermined standoff distance is between approximately 0.001 inches and approximately 0.005 inches.

16. The workpiece support of claim 1, wherein the one or more standoffs are comprised of a material operable to withstand high temperatures ranging between approximately 50 C and approximately 600 C without substantial degradation or compression.

17. The workpiece support of claim 1, wherein the one or more standoffs are comprised of a material having a hardness that is less than a hardness of the workpiece.

18. The workpiece support of claim 1, wherein the one or more standoffs are formed in a predetermined shape when viewed perpendicular to the support surface, wherein the predetermined shape is one of a rounded shape, circular shape, ovular shape, polygonal shape, and a freeform shape.

19. The workpiece support of claim 1, wherein the one or more standoffs are positioned on the support surface based on predetermined criteria.

20. The workpiece support of claim 1, wherein the workpiece support comprises one or more of a thermal workpiece support operable to heat and/or cool the workpiece.

21. A workpiece support, comprising:
an electrostatic chuck (ESC) having a support surface; and
one or more standoffs selectively coupled to the support surface, wherein the one or more standoffs are operable to support a workpiece at a predetermined standoff distance from the support surface, and wherein the one or more standoffs have a low thermal conductivity.

22. A workpiece support, comprising:
an electrostatic chuck (ESC) having a support surface; and
one or more standoffs selectively coupled to the support surface, wherein the one or more standoffs are operable to support a workpiece at a predetermined standoff distance from the support surface, and wherein the one or more standoffs and the support surface have similar dielectric strengths.

23. A workpiece support, comprising:
an electrostatic chuck (ESC) having a support surface; and
one or more standoffs selectively coupled to the support surface, wherein the one or more standoffs are operable to support a workpiece at a predetermined standoff distance from the support surface, and wherein the one or more standoffs are spaced along the support surface in a predetermined pattern, and wherein the one or more standoffs are initially defined on a transfer sheet, whereby the predetermined pattern is operable to be transferred from the transfer sheet to the support surface by placement of the transfer sheet on the support surface and selectively adhering the one or more standoffs from the transfer sheet to the support surface.

24. A workpiece support, comprising:
an electrostatic chuck (ESC) having a support surface; and
one or more standoffs selectively coupled to the support surface, wherein the one or more standoffs are operable to support a workpiece at a predetermined standoff distance from the support surface, and wherein the one or more standoffs are initially comprised of a liquid that is applied to the support surface and subsequently cured on the support surface.

25. A workpiece support, comprising:
an electrostatic chuck (ESC) having a support surface; and
one or more standoffs selectively coupled to the support surface, wherein the one or more standoffs are operable to support a workpiece at a predetermined standoff distance from the support surface, and wherein the one or more standoffs comprise a polyimide film.

26. An electrostatic chuck comprising one or more removable standoffs operable to support a workpiece at a predetermined distance from a surface of the electrostatic chuck.

27. The electrostatic chuck of claim 26, wherein the one or more removable standoffs comprise an electrically insulative film, and wherein an adhesive selectively couples the electrically insulative film to the surface of the electrostatic chuck.

* * * * *